US010607932B2

(12) United States Patent
Hung et al.

(10) Patent No.: US 10,607,932 B2
(45) Date of Patent: Mar. 31, 2020

(54) CIRCUIT STRUCTURE

(71) Applicant: E Ink Holdings Inc., Hsinchu (TW)

(72) Inventors: Yu-Chieh Hung, Hsinchu (TW); Kuan-Yi Lin, Hsinchu (TW); Chun-Yu Lu, Hsinchu (TW); Chia-Chun Yeh, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/122,871

(22) Filed: Sep. 5, 2018

(65) Prior Publication Data
US 2018/0366405 A1 Dec. 20, 2018

Related U.S. Application Data

(63) Continuation-in-part of application No. 15/641,206, filed on Jul. 3, 2017, now Pat. No. 10,103,201.

(30) Foreign Application Priority Data

Jul. 5, 2016 (CN) .......................... 2016 1 0521111
Jul. 5, 2016 (TW) .............................. 105121256 A
(Continued)

(51) Int. Cl.
H01L 23/498 (2006.01)
H01L 27/00 (2006.01)
(Continued)

(52) U.S. Cl.
CPC .. H01L 23/49838 (2013.01); H01L 23/49822 (2013.01); H01L 23/49827 (2013.01);
(Continued)

(58) Field of Classification Search
CPC ......... H01L 23/49838; H01L 23/49827; H01L 23/49894; H01L 23/49872;
(Continued)

(56) References Cited

U.S. PATENT DOCUMENTS 6,079,100 A 6/2000 Farquhar et al.
7,211,738 B2 5/2007 Lee et al.
(Continued)

FOREIGN PATENT DOCUMENTS

CN 1700472 A 11/2005
CN 1971940 A 5/2007
(Continued)

OTHER PUBLICATIONS

Related Chinese office action dated Jul. 3, 2019.
Related U.S. office action dated Jun. 5, 2019.

Primary Examiner — Nikolay K Yushin
(74) Attorney, Agent, or Firm — CKC & Partners Co., LLC

(57) ABSTRACT

A circuit structure includes a flexible substrate, an inorganic barrier layer, a first wire, a second wire, a third wire, a fourth wire, an organic dielectric layer, a first conductive via, and a second conductive via. The inorganic barrier layer is disposed over the flexible substrate. The first and second wires are disposed on the inorganic barrier layer and contact the inorganic barrier layer. The first and second wires are separated from each other. The organic dielectric layer is disposed over the first and second wires. The third wire is disposed in the organic dielectric layer. The fourth wire is disposed above the organic dielectric layer. The first conductive via is disposed in the organic dielectric layer and contacts the first and third wires. The second conductive via is disposed in the organic dielectric layer and contacts the second and fourth wires.

15 Claims, 13 Drawing Sheets

(30) Foreign Application Priority Data

May 10, 2017 (TW) .............................. 106115496 A
Aug. 28, 2018 (TW) .............................. 107130011 A

(51) Int. Cl.
    H01L 29/00    (2006.01)
    H01L 27/12    (2006.01)
    H01L 29/786   (2006.01)

(52) U.S. Cl.
    CPC .. *H01L 23/49872* (2013.01); *H01L 23/49894* (2013.01); *H01L 27/124* (2013.01); *H01L 27/1218* (2013.01); *H01L 29/78603* (2013.01)

(58) Field of Classification Search
    CPC ........... H01L 23/49822; H01L 27/1218; H01L 27/124; H01L 27/3276; H01L 29/78603; H01L 29/0676
    See application file for complete search history.

(56) References Cited

U.S. PATENT DOCUMENTS

| | | |
|---|---|---|
| 7,507,592 B2 | 3/2009 | Lee et al. |
| 7,929,101 B2 | 4/2011 | Shinn et al. |
| 8,299,702 B2 | 10/2012 | Choi et al. |
| 8,330,712 B2 | 12/2012 | Park et al. |
| 8,686,407 B2 | 4/2014 | Shu et al. |
| 9,601,557 B2 | 3/2017 | Yang et al. |
| 9,659,966 B2 | 5/2017 | Kwak et al. |
| 2007/0063645 A1* | 3/2007 | Yokoyama ........ G02F 1/133555 313/506 |
| 2007/0145359 A1 | 6/2007 | Che |
| 2007/0152211 A1 | 7/2007 | Han |
| 2009/0315458 A1 | 12/2009 | Choi et al. |
| 2010/0026951 A1 | 2/2010 | Chiang et al. |
| 2011/0024179 A1 | 2/2011 | Nomoto |
| 2013/0207099 A1 | 8/2013 | Shu et al. |
| 2013/0302998 A1 | 11/2013 | Kugler |
| 2014/0060893 A1 | 3/2014 | Lee |
| 2014/0217397 A1 | 8/2014 | Kwak et al. |
| 2014/0225096 A1 | 8/2014 | Han et al. |
| 2015/0060784 A1 | 3/2015 | Lee et al. |
| 2015/0115259 A1 | 4/2015 | Yamazaki et al. |
| 2016/0307988 A1 | 10/2016 | Kim et al. |
| 2017/0212375 A1 | 7/2017 | Yan et al. |
| 2017/0212396 A1 | 7/2017 | Cao |

FOREIGN PATENT DOCUMENTS

| | | |
|---|---|---|
| CN | 101615624 A | 12/2009 |
| CN | 103247657 A | 8/2013 |
| CN | 203982331 U | 12/2014 |
| TW | 548757 B | 8/2003 |
| TW | 200704327 A | 1/2007 |
| TW | 200810657 A | 2/2008 |
| TW | 200951538 A | 12/2009 |
| TW | 201445747 A | 12/2014 |
| TW | 201519445 A | 5/2015 |
| TW | 201717387 A | 5/2017 |
| TW | 201813459 A | 4/2018 |

* cited by examiner

CIRCUIT STRUCTURE

CROSS-REFERENCE TO RELATED APPLICATION

The present application is a Continuation-in-part of U.S. application Ser. No. 15/641,206, filed Jul. 3, 2017, which claims priority to Taiwan Application Serial Number 105121256, filed Jul. 5, 2016, and claims priority to Taiwan Application Serial Number 106115496, filed May 10, 2017, which claims priority to China Application Serial Number 201610521111.6, filed Jul. 5, 2016. The present application also claims priority to Taiwan Application Serial Number 107130011, filed Aug. 28, 2018. All of these applications are herein incorporated by reference.

BACKGROUND

Field of Invention

The disclosure relates to a circuit structure.

Description of Related Art

In general, an organic thin film transistor (TFT) array display device has an organic buffer layer, an organic gate isolation layer, and an organic protective layer which are sequentially stacked on an edge of a flexible substrate. A data line is disposed between the organic buffer layer and the organic gate isolation layer, and a gate line is disposed between the organic gate isolation layer and the organic protective layer. The data line and the gate line are connected to an integrated circuit (IC) chip and a flexible circuit board respectively.

However, the data line and the gate line are generally made of a metallic material, while the organic buffer layer, the organic gate isolation layer, and the organic protective layer are generally made of an organic material. When a metal circuit is formed on the organic material, there is a problem that adhesion is poor. As a result, when the display device is bent due to stress, the metal circuit having poor adhesion is likely to be displaced and fractured.

SUMMARY

An aspect of the disclosure provides a circuit structure including a flexible substrate, an inorganic barrier layer, a first wire, a second wire, a third wire, a fourth wire, an organic dielectric layer, a first conductive via, and a second conductive via. The inorganic barrier layer is disposed over the flexible substrate. The first wire and the second wire are disposed on the inorganic barrier layer and are in contact with the inorganic barrier layer. The first wire and the second wire are separated from each other. The organic dielectric layer is disposed over the first wire and the second wire. The third wire is disposed in the organic dielectric layer. The fourth wire is disposed over the organic dielectric layer. The first conductive via is disposed in the organic dielectric layer and is in contact with the first wire and the third wire. The second conductive via is disposed in the organic dielectric layer and is in contact with the second wire and the fourth wire.

In some embodiments of the disclosure, the first wire is substantially parallel with the second wire.

In some embodiments of the disclosure, a distance between the first wire and the second wire ranges from 4 to 10 micrometers.

In some embodiments of the disclosure, the organic dielectric layer has a first via hole and a second via hole. The first via hole exposes an exposed portion of the first wire and the second via hole exposes an exposed portion of the second wire.

In some embodiments of the disclosure, the circuit structure further includes a first conductive pad layer and a second conductive pad layer. The first conductive pad layer covers a side wall of the first via hole and the exposed portion of the first wire. The second conductive pad layer covers a side wall of the second via hole and the exposed portion of the second wire.

In some embodiments of the disclosure, the third wire is in contact with the first conductive pad layer and the fourth wire is in contact with the second conductive pad layer.

In some embodiments of the disclosure, the circuit structure further includes an integrated circuit chip. The integrated circuit chip is electrically connected to the first wire and the second wire. A horizontal distance between the first conductive via and an edge of the integrated circuit chip is 300 micrometers to 600 micrometers, and a horizontal distance between the second conductive via and an edge of the integrated circuit chip is 300 micrometers to 600 micrometers.

In some embodiments of the disclosure, the organic dielectric layer includes an organic buffer layer and an organic gate isolation layer disposed on the organic buffer layer. The third wire is disposed between the organic buffer layer and the organic gate isolation layer, and the fourth wire is disposed over the organic gate isolation layer.

In some embodiments of the disclosure, the first wire and the second wire include molybdenum, molybdenum chromium alloy, aluminum, aluminum bismuth alloy, or titanium.

Another aspect of the disclosure provides a circuit structure which includes a flexible substrate, an inorganic barrier layer, a first wire, a second wire, a third wire, a fourth wire, a fifth wire, an organic dielectric layer, a first conductive via, and a second conductive via. The inorganic barrier layer is disposed over the flexible substrate. The first wire, the second wire, and the third wire are disposed on the inorganic barrier layer and are in contact with the inorganic barrier layer. The first wire, the second wire, and the third wire are separated from each other. The first wire has a first conductive connection region, the second wire has a second conductive connection region, and the third wire has a third conductive connection region and a fourth conductive connection region. The organic dielectric layer is disposed over the first wire and the second wire. The fourth wire is disposed in the organic dielectric layer. The fifth wire is disposed over the organic dielectric layer. The first conductive via is disposed in the organic dielectric layer and is in contact with the first wire and the fourth wire. The second conductive via is disposed in the organic dielectric layer and is in contact with both the second wire and the fifth wire.

In some embodiments of the disclosure, the first wire is substantially parallel with the second wire.

In some embodiments of the disclosure, a distance between the first wire and the second wire ranges from 4 to 10 micrometers.

In some embodiments of the disclosure, the first wire, the second wire, and the third wire include titanium, nickel boride, or indium tin oxide.

In some embodiments of the disclosure, the circuit structure further includes a protective layer. The protective layer is disposed between the inorganic barrier layer and the organic dielectric layer and covering the first wire, the second wire, and the third wire. The protective layer has a first via hole exposing the first conductive connection region of the first wire, a second via hole exposing the second conductive connection region of the second wire, a third via hole exposing the third conductive connection region of the third wire, and a fourth via hole exposing the fourth conductive connection region of the third wire.

In some embodiments of the disclosure, the circuit structure further includes a first conductive pad layer, a second conductive pad layer, a third conductive pad layer, and a fourth conductive pad layer. The first conductive pad layer covers a side wall of the first via hole and the first conductive connection region of the first wire. The second conductive pad layer covers a side wall of the second via hole and a second conductive connection region of the second wire. The third conductive pad layer covers a side wall of the third via hole and a third conductive connection region of the third wire. The fourth conductive pad layer covers a side wall of the third via hole and a fourth conductive connection region of the third wire.

The above description will be described in detail below with reference to the embodiments, and the technical solution of the disclosure will be further explained.

DETAILED DESCRIPTION

Figure 1:
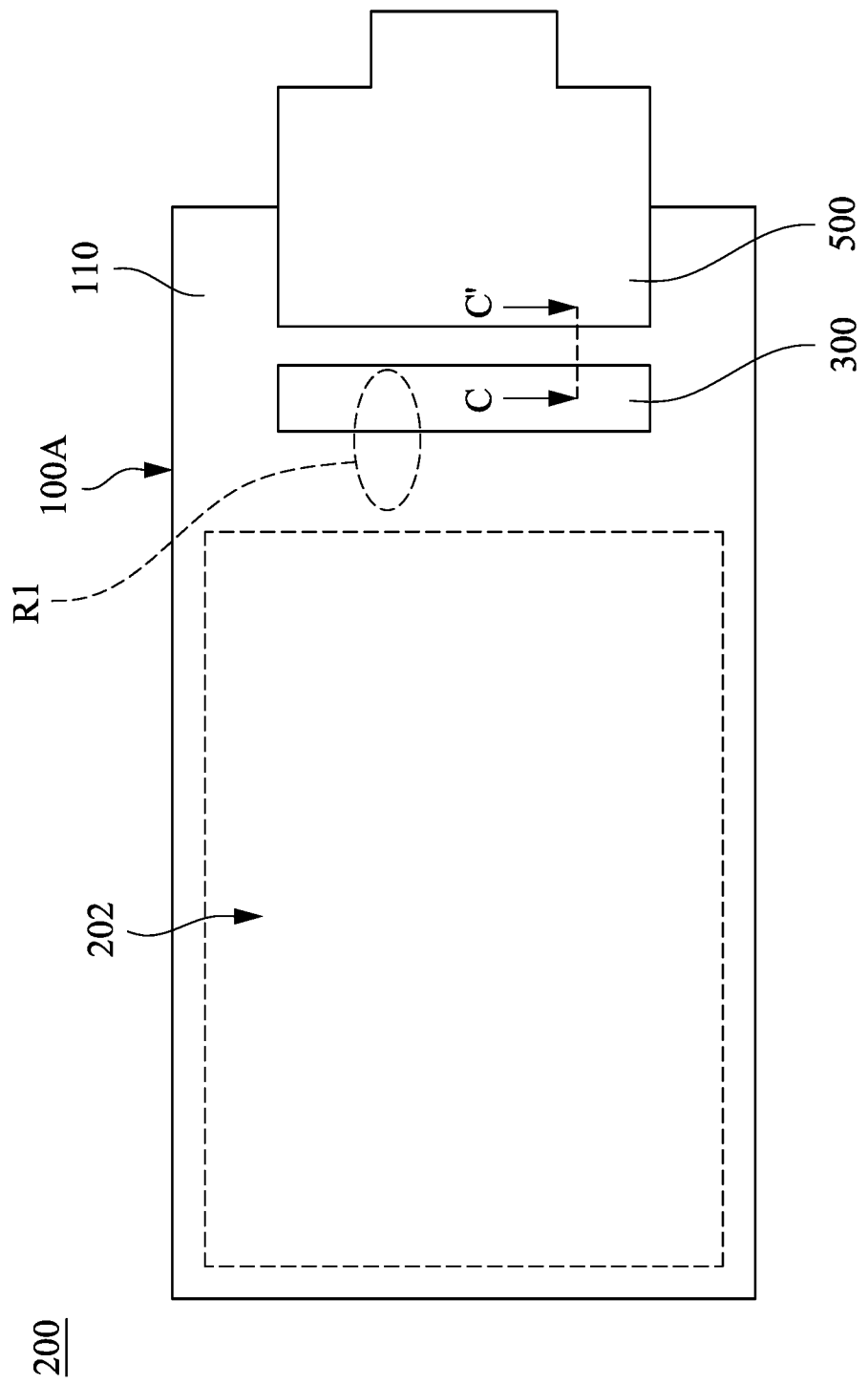
FIG. 1 is a schematic top view of a display device according to an embodiment of the disclosure.

In order to make the description of the disclosure more detailed and complete, the following illustratively describes implementation aspects and specific embodiments of the disclosure; however, this is not the only form in which the specific embodiments of the disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the disclosure may be practiced without these specific details.

Specific embodiments of the components and arrangements described below are intended to simplify the disclosure. Of course, these are merely embodiments and are not intended to limit the disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

The embodiments of the disclosure are described in detail below, but the disclosure is not limited to the scope of the embodiments.

FIG. 1 illustrates a schematic top view of a display device 200 according to an embodiment of the disclosure. The display device 200 has a display area 202. A circuit structure 100A is located at an edge of the display device 200, for example, outside the display area 202. An integrated circuit chip 300 and a flexible circuit board 500 are located outside the display area 202.

Figure 2:
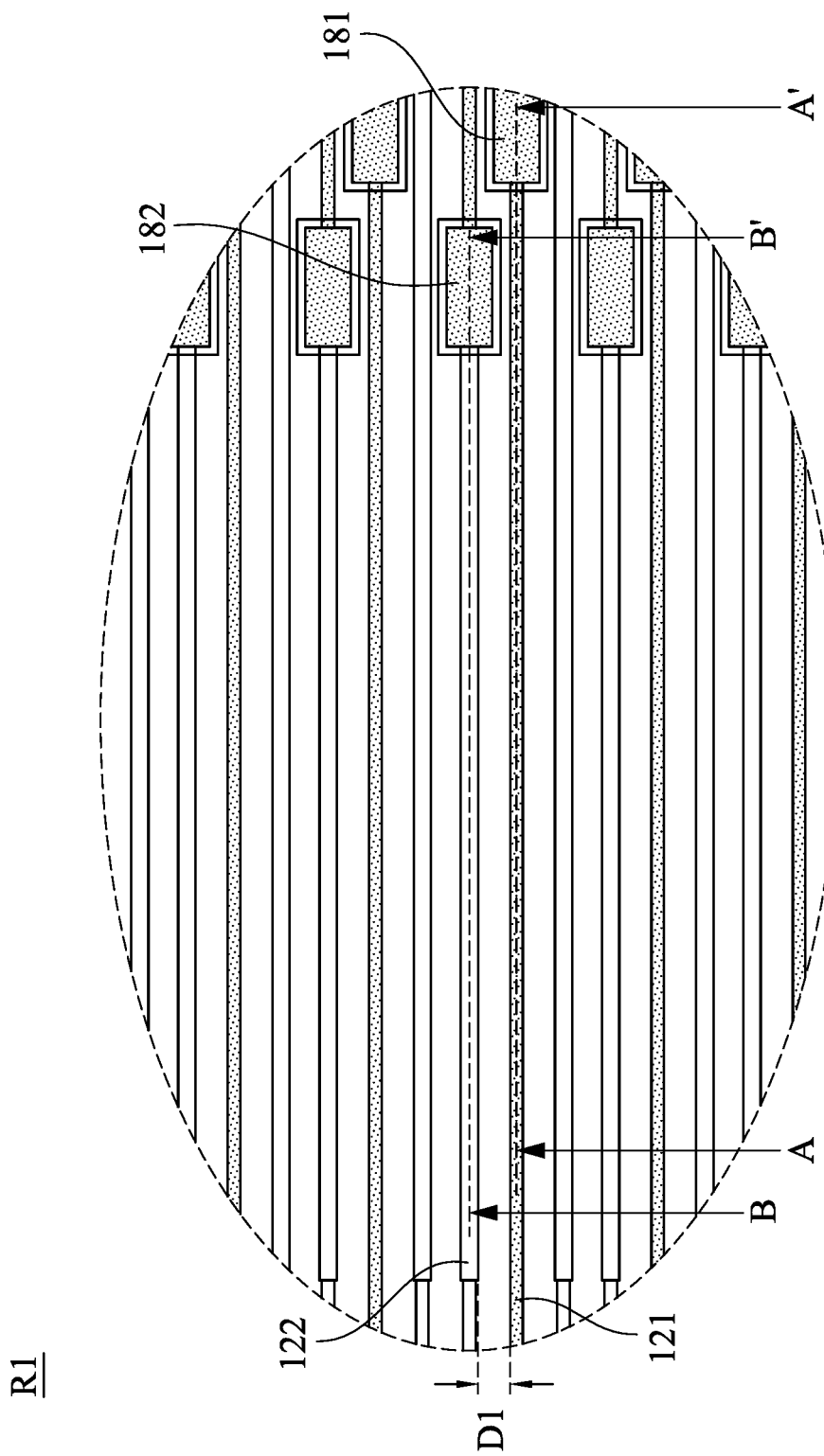
FIG. 2 is a partially enlarged view of a region of a circuit structure of the display device of FIG. 1.
Figure 3A:
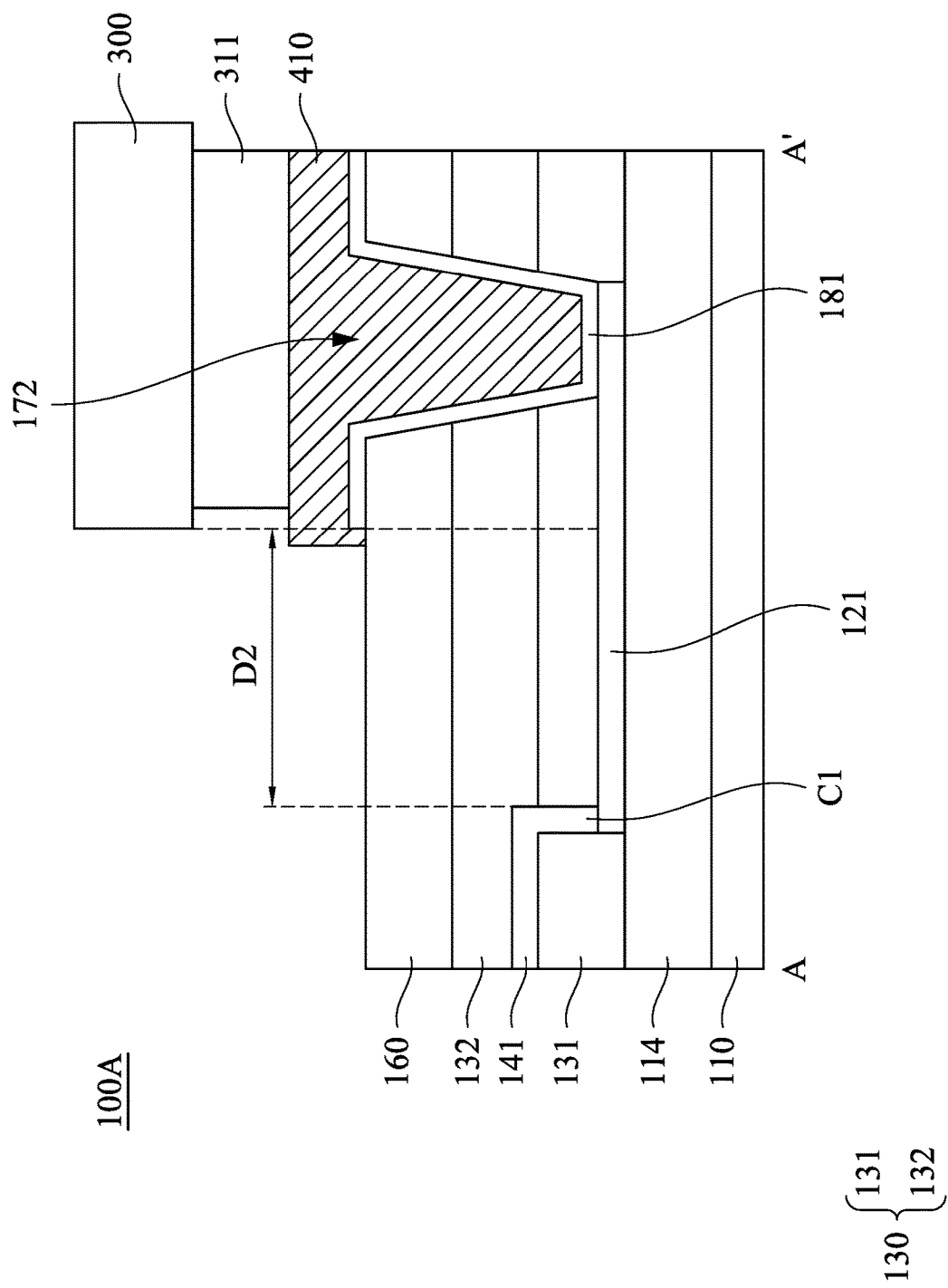
FIG. 3A is a schematic cross-sectional view of a circuit structure taken along a cutting line A-A' according to an embodiment of the disclosure.
Figure 3B:
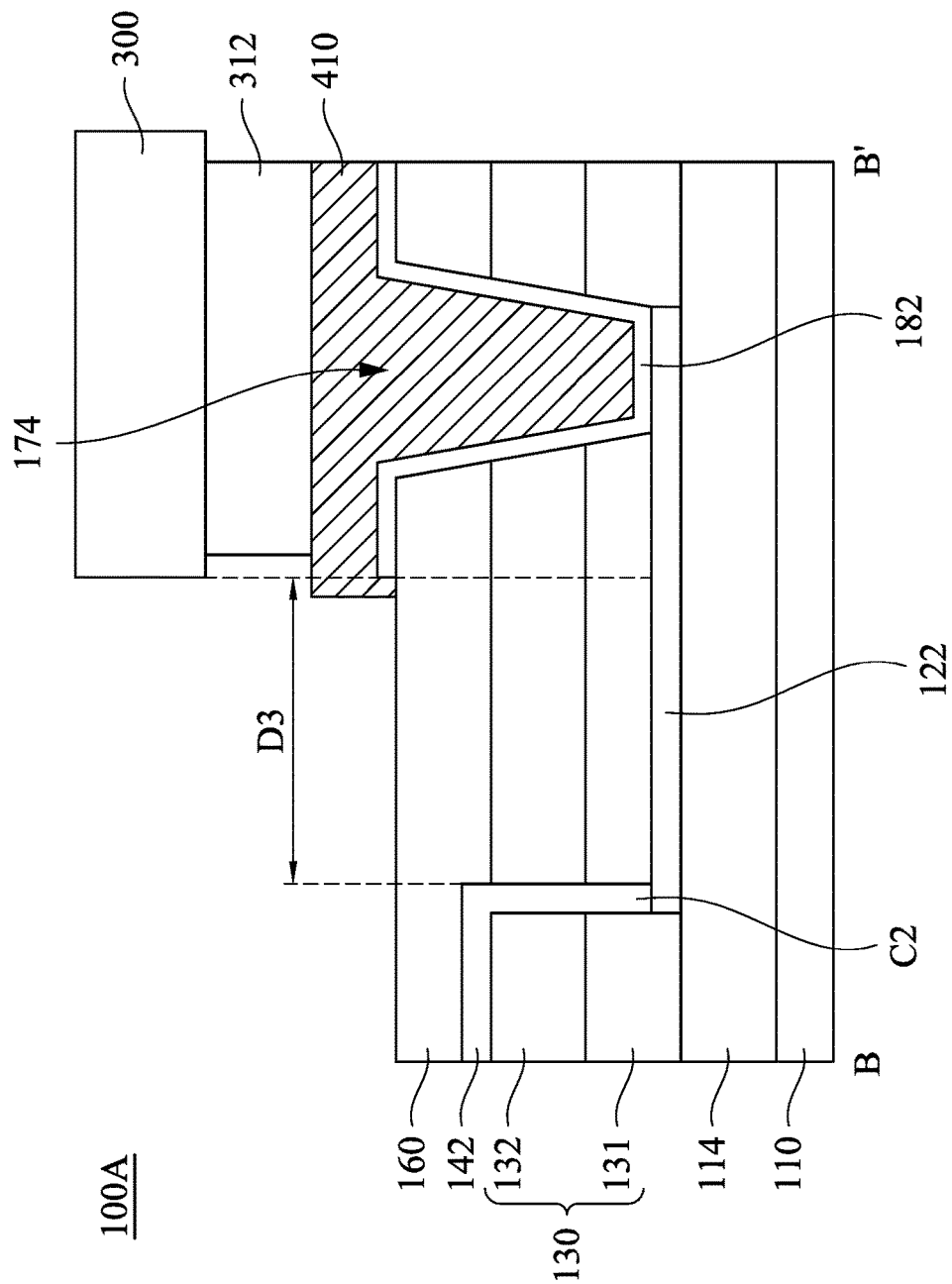
FIG. 3B is a schematic cross-sectional view of a circuit structure taken along a cutting line B-B' according to an embodiment of the disclosure.

Please refer to FIGS. 2, 3A, and 3B FIG. 2 illustrates a partially enlarged view of a region R1 of a circuit structure 100A of a display device 200 of FIG. 1. FIGS. 3A and 3B respectively illustrate schematic cross-sectional views of a circuit structure 100A taken along a cutting line A-A' and a cutting line B-B' of FIG. 2, according to an embodiment of the disclosure.

The circuit structure 100A includes a flexible substrate 110, an inorganic barrier layer 114, a first wire 121, a second wire 122, a third wire 141, a fourth wire 142, an organic dielectric layer 130, an organic protective layer 160, a first conductive via C1, and a second conductive via C2.

As shown in FIGS. 3A and 3B, the inorganic barrier layer 114 is disposed over the flexible substrate 110. In some embodiments, the flexible substrate 110 includes polyimide (PI) or polyethylene terephthalate (PET), but is not limited thereto. In some embodiments, the inorganic barrier layer 114 includes tantalum nitride or tantalum oxide, but is not limited thereto.

The first wire 121 and the second wire 122 are disposed on the inorganic barrier layer 114 and are in contact with the inorganic barrier layer 114. In addition, the first wire 121 and the second wire 122 are separated from each other. In some embodiments, the first wire 121 and the second wire 122 include a metal material such as molybdenum, molybdenum chromium alloy, aluminum, aluminum bismuth alloy or titanium, but are not limited thereto. It should be understood that since the inorganic barrier layer 114 is made of non-organic material, the first wire 121 and the second wire 122 which are located on the inorganic barrier layer 114 have excellent adhesion with the inorganic barrier layer 114.

According to various embodiments, the integrated circuit chip 300 used for the disclosure may be an integrated drive chip that integrates a data line driving function and a gate line driving function. Therefore, the integrated circuit chip 300 has a first metal bump 311 (indicated in FIG. 3A) and a second metal bump 312 (indicated in FIG. 3B). The first metal bump 311 and the second metal bumps 312 can be, for example, chip pins, which are used to be electrically connected to the data line and the gate line, respectively. In some embodiments, the first wire 121 is used to connect the metal bump 311 of the integrated circuit chip 300 with the third wire 141 (such as a data line), while the second wire 122 is used to connect the metal bump 312 of the integrated circuit chip 300 with the fourth wire 142 (such as a gate line). Specifically, as shown in FIG. 2, the first wire 121 is substantially parallel with the second wire 122, and a distance D1 between the first wire 121 and the second wire 122 is ranged from 4 to 10 micrometers.

As shown in FIGS. 3A and 3B, the organic dielectric layer 130 is disposed over the inorganic barrier layer 114 and includes an organic buffer layer 131 and an organic gate isolation layer 132. The organic gate isolation layer 132 is disposed over the organic buffer layer 131. The organic protective layer 160 is disposed on the organic gate isolation layer 132. Specifically, the third wire 141 is disposed between the organic buffer layer 131 and the organic gate isolation layer 132, and the fourth wire 142 is disposed over the organic gate isolation layer 132. In some embodiments, the third wire 141 is, for example, a data line, and the fourth wire 142 is, for example, a gate wire. In some embodiments, the third wire 141 and the fourth wire 142 include a metal material such as aluminum, copper, nickel or silver.

The first conductive via C1 is disposed in the organic buffer layer 131, and the two ends of the first conductive via C1 are in contact with the first wire 121 and the third wire 141 respectively, so that the first wire 121 and the third wire 141 are electrically connected. Similarly, the second conductive via C2 is disposed in the organic buffer layer 131 and the organic gate isolation layer 132, and the two ends of the second conductive via C2 are in contact with the second wire 122 and the fourth wire 142 respectively, so that the second wire 122 is electrically connected to the fourth wire 142.

It is noted that in the prior art, data lines and gate lines in the vicinity of the integrated circuit chip 300 (for example, within a horizontal distance of about 300 micrometers to 600 micrometers from an edge of the integrated circuit chip 300) are easily broken by pulling. However, in the circuit structure 100A of the disclosure, the first wire 121 and the second wire 122 are disposed on the inorganic barrier layer 114. As described above, the first wire 121 and the second wire 122 have excellent adhesion with the inorganic barrier layer 114. Therefore, the problem that the wires in the vicinity of the integrated circuit chip 300 are easily broken by pulling is solved.

In detail, the horizontal distance D2 between the first conductive via C1 in contact with the first wire 121 and the edge of the integrated circuit chip 300 is 300 micrometers to 600 micrometers. The horizontal distance D3 between the second conductive via C2 in contact with the second wire 122 and the edge of the integrated circuit chip 300 is 300 micrometers to 600 micrometers. In other words, a horizontal distance between one end of the first wire 121 away from the integrated circuit chip 300 and the edge of the integrated circuit chip 300 is 300 micrometers to 600 micrometers. A horizontal distance between one end of the second wire 122 away from the integrated circuit chip 300 and the edge of the integrated circuit chip 300 is 300 micrometers to 600 micrometers.

In order to electrically connect the first metal bump 311 of the integrated circuit chip 300 with the first wire 121 embedded below the organic buffer layer 131, the organic protective layer 160, the organic gate isolation layer 132, and the organic buffer layer 131 jointly have a first via hole 172 that exposes an exposed portion of the first wire 121. Therefore, the first wire 121 can be electrically connected to the first metal bump 311 through a first conductive pad layer 181 and an anisotropic conductive adhesive layer 410 covering the first conductive pad layer 181. Specifically, the first conductive pad layer 181 covers a portion of the organic protective layer 160, a side wall of the first via hole 172, and the exposed portion of the first wire 121. The anisotropic conductive adhesive layer 410 covers the first conductive pad layer 181 and fills the remaining portion of the first via hole 172.

Similarly, in order to electrically connect the second metal bump 312 of the integrated circuit chip 300 with the second wire 122 embedded below the organic buffer layer 131, the organic protective layer 160, the organic gate isolation layer 132, and the organic buffer layer 131 jointly have a second via hole 174 that exposes an exposed portion of the second wire 122. Thus, the second wire 122 can be electrically connected to the second metal bump 312 through the second conductive pad layer 182 and the anisotropic conductive adhesive layer 410 covering the second conductive pad layer 182. Specifically, the second conductive pad layer 182 covers a portion of the organic protective layer 160, a side wall of the second via hole 174, and the exposed portion of the second wire 122. The anisotropic conductive adhesive layer 410 covers the second conductive pad layer 182 and fills the remaining portion of the second via hole 174.

Figure 4:
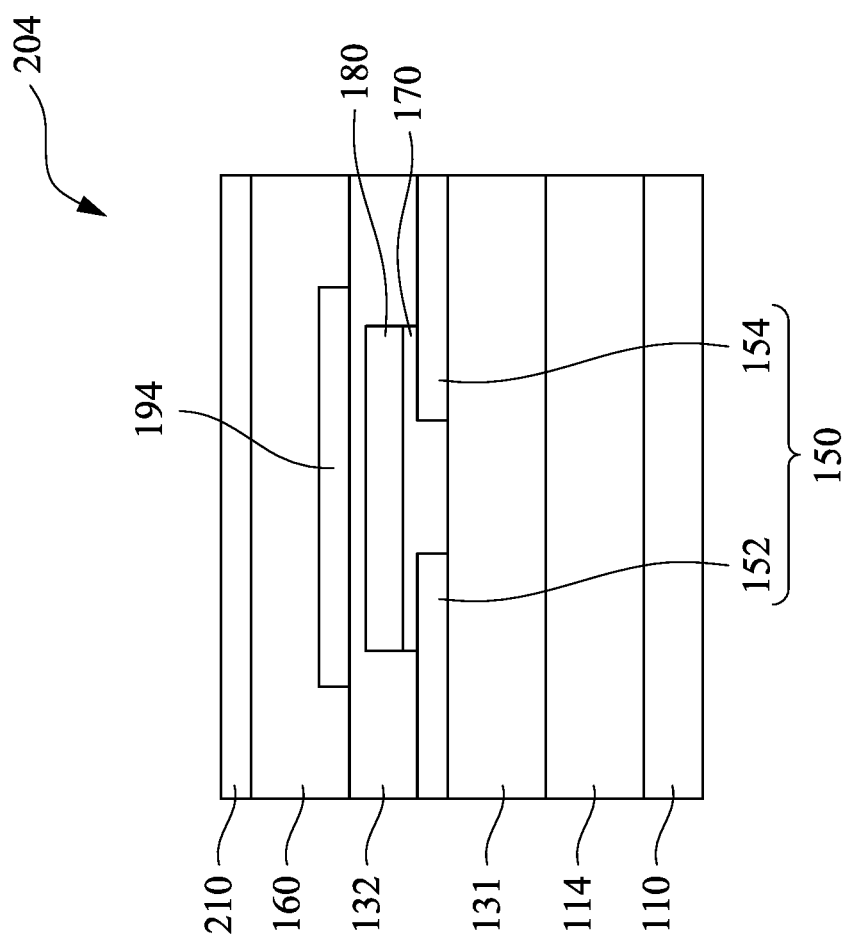
FIG. 4 is a schematic cross-sectional view of a single sub-pixel in a display area of a display device according to an embodiment of the disclosure.

Referring to FIG. 4, it illustrates a schematic cross-sectional view of a single sub-pixel 204 in a display area 202 of a display device 200 in FIG. 1. As shown in FIG. 4, the sub-pixel 204 includes a sub-pixel transistor and a pixel electrode 210. Specifically, the sub-pixel transistor includes a source/drain layer 150, a semiconductor layer 170, a photoresist layer 180, and a gate 194.

The source/drain layer 150 is disposed on the organic buffer layer 131 and has a source region 152 and a drain region 154 which are separated from each other. The semiconductor layer 170 is disposed on a portion of the source region 152, a portion of the drain region 154, and the organic buffer layer 131 between the source region 152 and the drain region 154. The photoresist layer 180 is disposed on the semiconductor layer 170 and located between the organic gate isolation layer 132 and the semiconductor layer 170. The photoresist layer 180 includes an organic material and can serve as an organic photoresist (OPR) layer. The gate 194 is disposed on the organic gate isolation layer 132 and covered by the organic protective layer 160.

The pixel electrode 210 is disposed on the organic protective layer 160. It is noted that the third wire 141 in FIG. 3A extends toward the display area 202 and is connected to the source/drain layer 150, such as the source region 152. In addition, the fourth wire 142 in FIG. 3B extends toward the display area 202 and is connected to the gate 194.

Figure 5A:
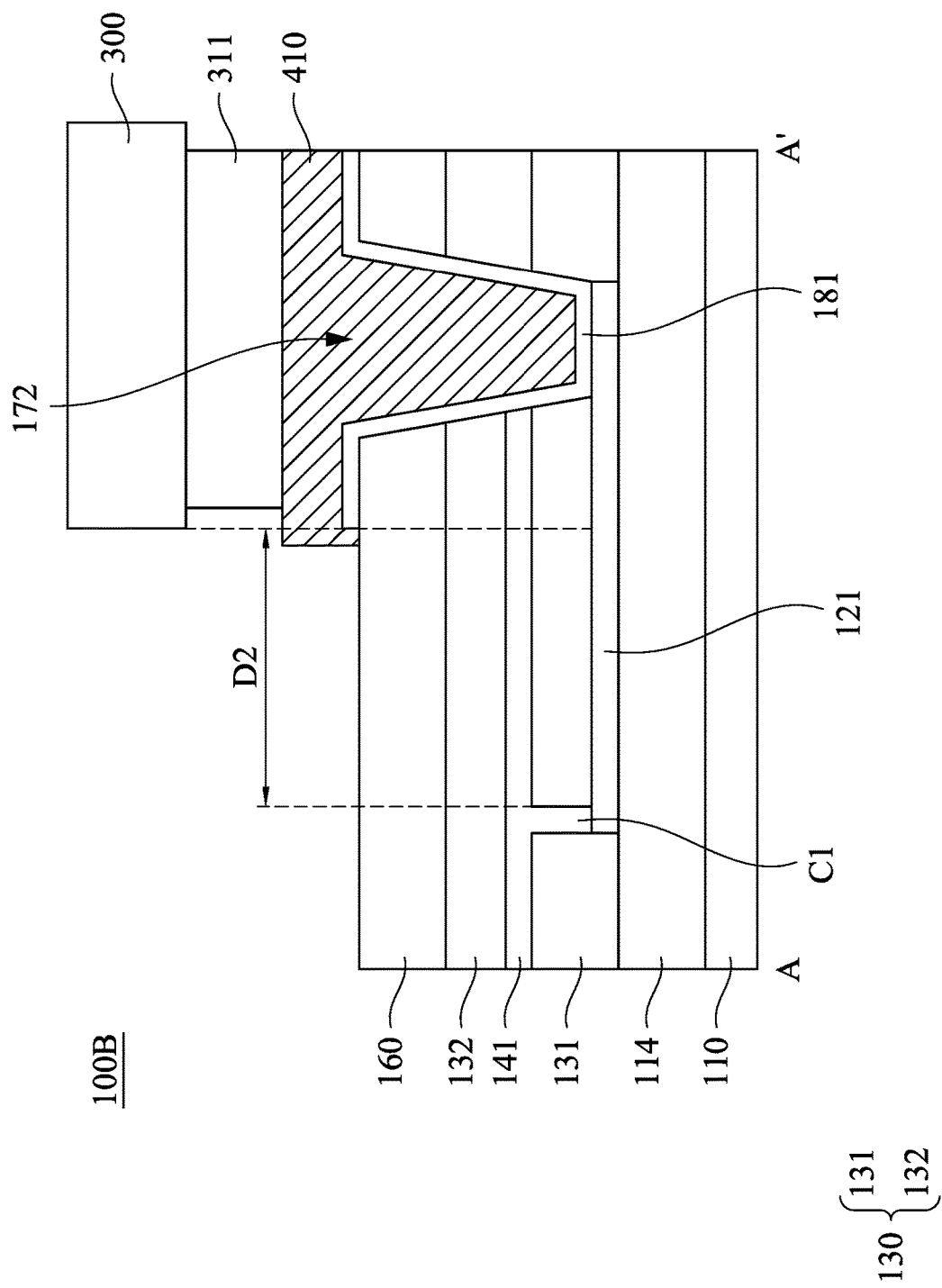
FIG. 5A is a schematic cross-sectional view of a circuit structure taken along a cutting line A-A' according to an embodiment of the disclosure.
Figure 5B:
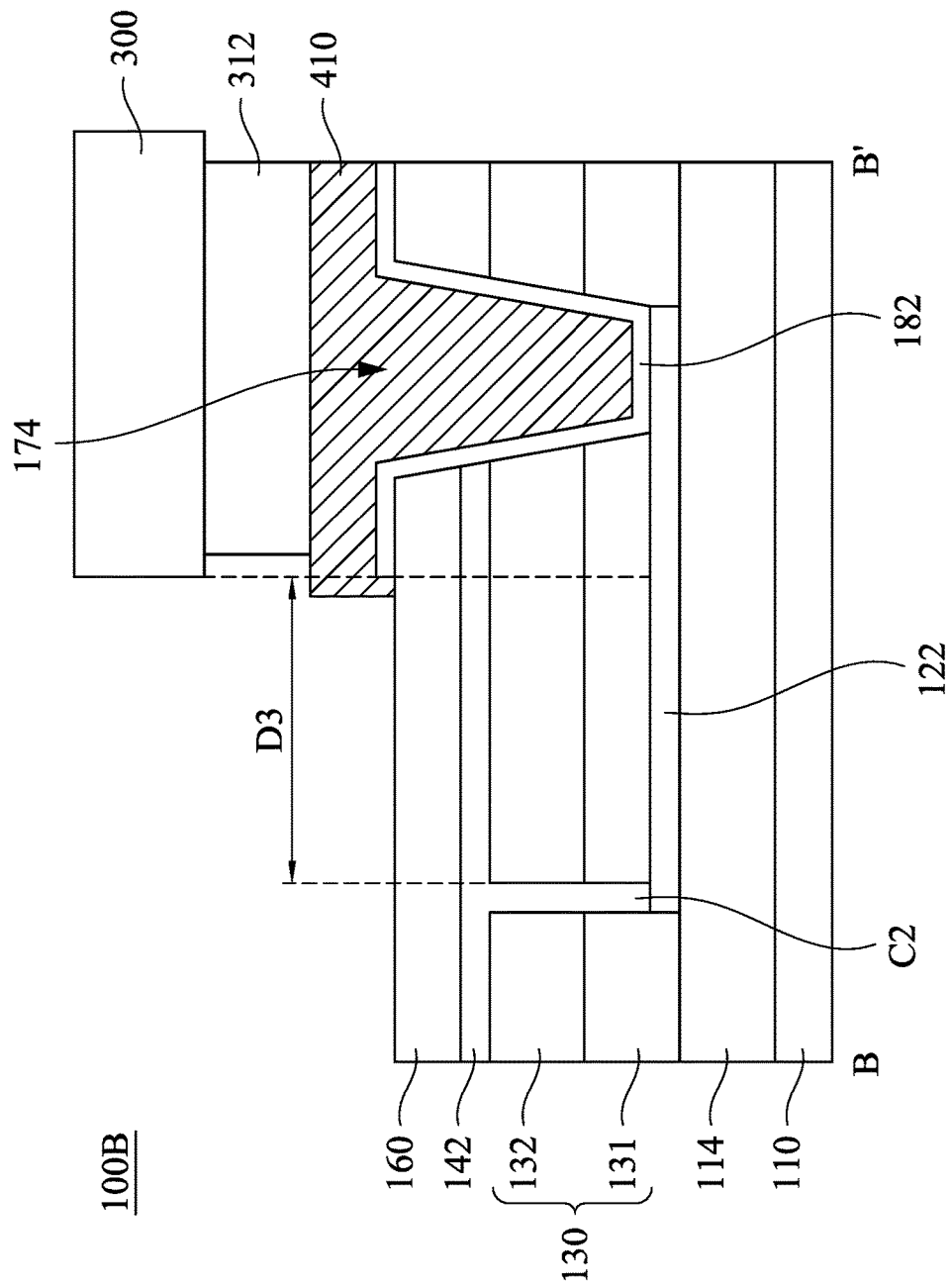
FIG. 5B is a schematic cross-sectional view of a circuit structure taken along a cutting line B-B' according to an embodiment of the disclosure.

FIGS. 5A and 5B respectively illustrate schematic cross-sectional views of a circuit structure 100B taken along a cutting line A-A' and a cutting line B-B' of FIG. 2, according to another embodiment of the disclosure. It is noted that, in FIGS. 5A and 5B, the same or similar components as those of FIGS. 3A and 3B are given the same reference numerals, and the related description is omitted. The circuit structure 100B of FIGS. 5A and 5B is similar to the circuit structure 100A of FIGS. 3A and 3B. The difference is that the third wire 141 in FIGS. 5A and 5B extends toward the first conductive pad layer 181 and is in contact with the first conductive pad layer 181, while the fourth wire 142 extends toward the second conductive pad layer 182 and is in contact with the second conductive pad layer 182. As a result, the first metal bump 311 can still maintain an electrical connection with the third wire 141 even if the first wire 121 of the circuit structure 100B is broken compared to the circuit structure 100A. Similarly, even if the second wire 122 of the circuit structure 100B is broken, the second metal bump 312 can still maintain an electrical connection with the fourth wire 142.

Figure 6A:
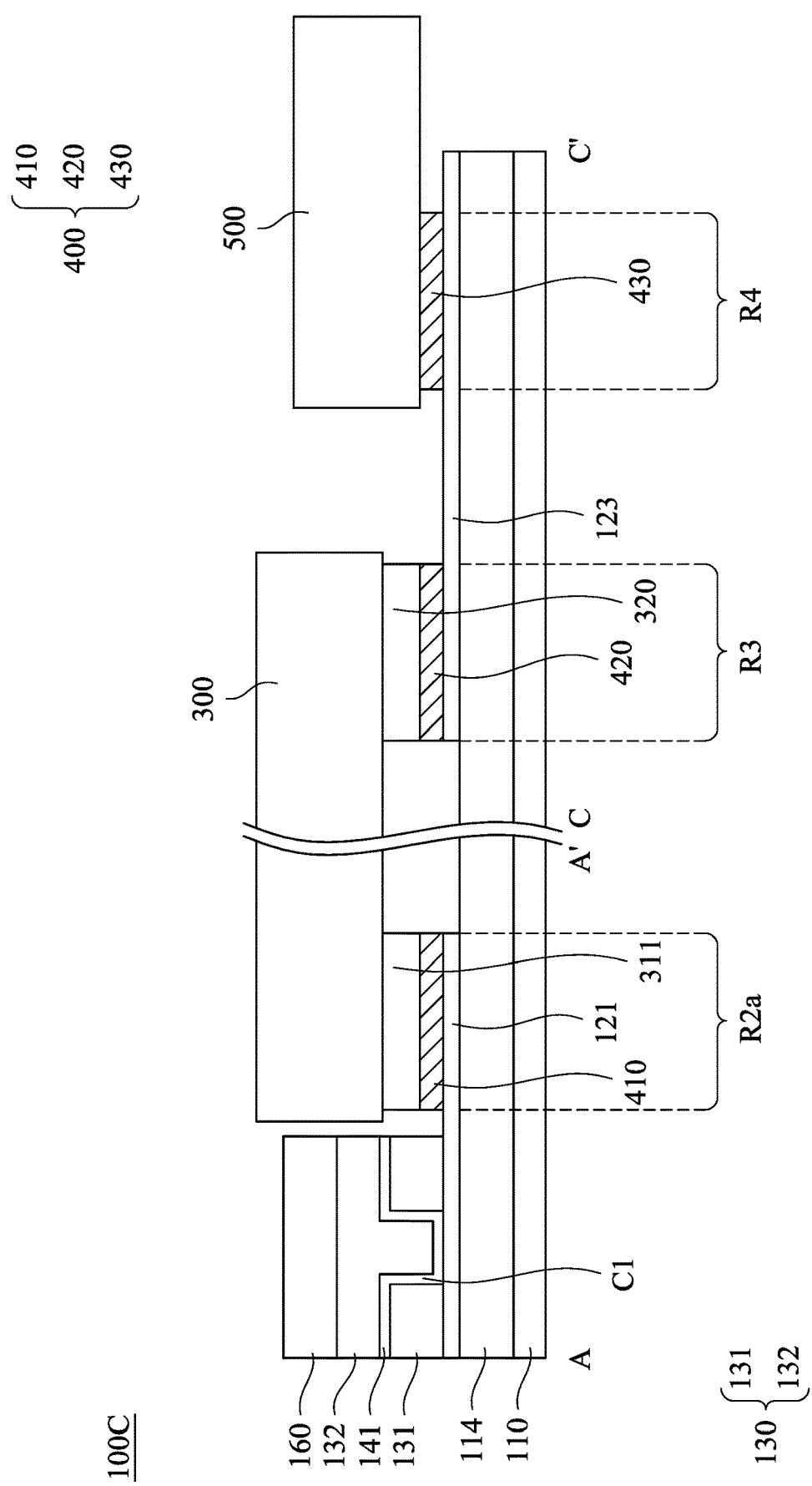
FIG. 6A is a schematic cross-sectional view of a circuit structure taken along cutting lines A-A' and C-C' according to an embodiment of the disclosure.
Figure 6B:
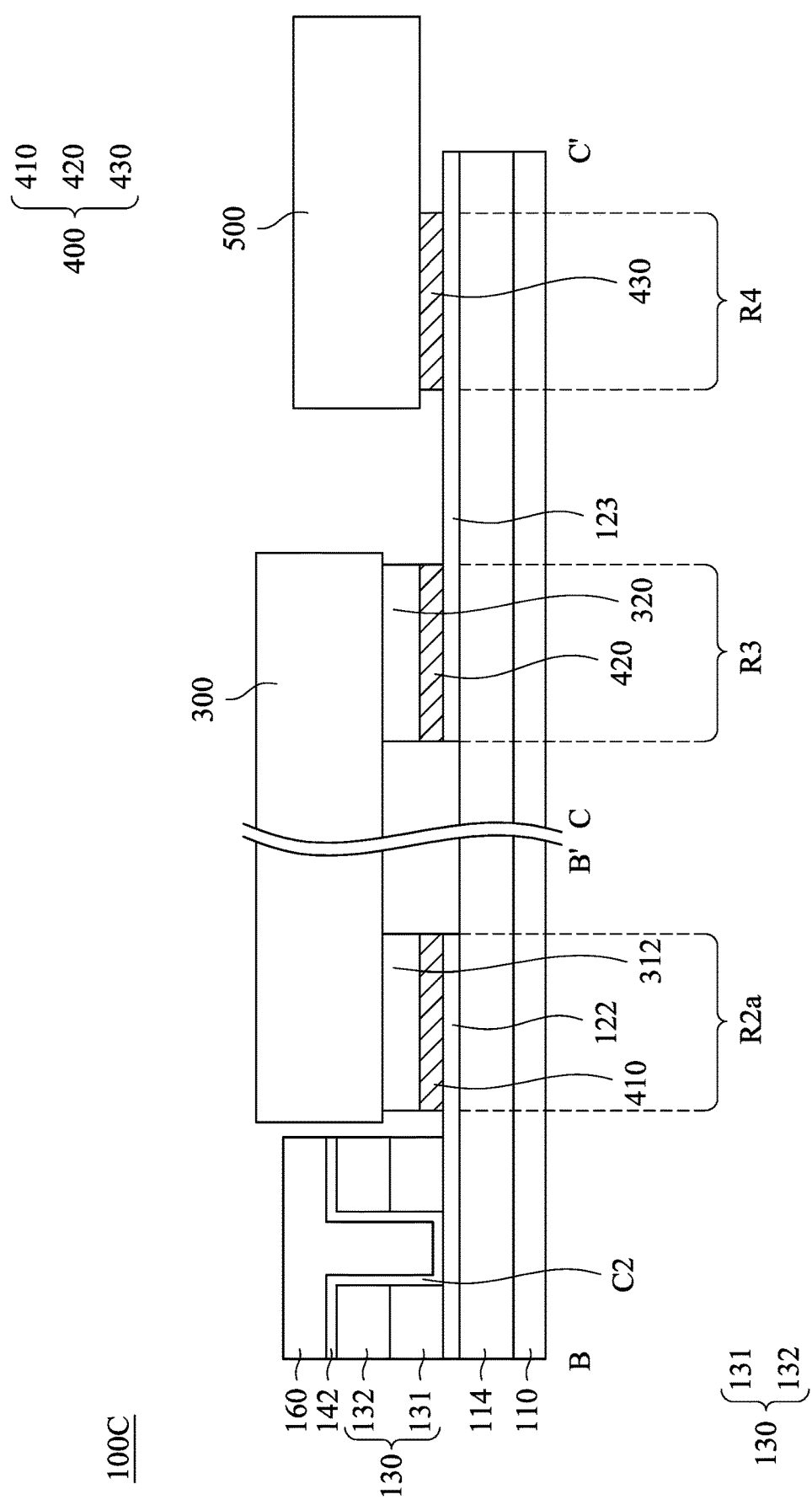
FIG. 6B is a schematic cross-sectional view of a circuit structure taken along cutting lines B-B' and C-C' according to an embodiment of the disclosure.

FIG. 6A is a schematic cross-sectional view of a circuit structure 100C taken along a cutting line A-A' of FIG. 2 and a cutting line C-C' of FIG. 1, according to another embodiment of the disclosure. FIG. 6B illustrates a schematic cross-sectional view of a circuit structure 100C taken along a cutting line B-B' of FIG. 2 and a cutting line C-C' of FIG. 1.

Please refer to FIGS. 2, 6A, and 6B. The circuit structure 100C includes a flexible substrate 110, an inorganic barrier layer 114, a first wire 121, a second wire 122, a third wire 123, a four wire 141, a fifth wire 142, an organic dielectric layer 130, an organic protective layer 160, a first conductive via C1, and a second conductive via C2.

The inorganic barrier layer 114 is disposed over the flexible substrate 110. The first wire 121, the second wire 122, and the third wire 123 are disposed on the inorganic barrier layer 114 and are in contact with the inorganic barrier layer 114. Besides, the first wire 121, the second wire 122, and the third wire 123 are separated from each other. It is understood that since the inorganic barrier layer 114 is made of a non-organic material, the first wire 121, the second wire 122, and the third wire 123 which are located on the inorganic barrier layer 114 have excellent adhesion with the inorganic barrier layer 114.

As shown in FIG. 2, the first wire 121 is substantially parallel with the second wire 122, and a distance D1 between the first wire 121 and the second wire 122 is ranged from 4 to 10 micrometers.

As shown in FIGS. 6A and 6B, the first wire 121 has a first conductive connection region R2a for being electrically connected with the first metal bump 311 of the integrated circuit chip 300 through the anisotropic conductive adhesive layer 410. The second wire 122 has a second conductive connection region R2b for being electrically connected to the second metal bump 312 of the integrated circuit chip 300 through the anisotropic conductive adhesive layer 410. In addition, the third wire 123 has a third conductive connection region R3 and a fourth conductive connection region R4. The third conductive connection region R3 is used for being electrically connected to the third metal bump 320 of the integrated circuit chip 300 through the anisotropic conductive adhesive layer 420. The fourth conductive connection region R4 is used for being electrically connected to the flexible circuit board 500 through the anisotropic conductive adhesive layer 430.

Since a portion of the first wire 121, a portion of the second wire 122, and the third wire 123 are exposed to the outside, in some embodiments, the first wire 121, the second wire 122, and the third guide 123 include corrosion-resistant metals such as titanium, nickel boride or indium tin oxide. In some embodiments, the first wire 121, the second wire 122, and the third wire 123 may be of a multi-layered structure in which an outermost layer includes a corrosion-resistant metal and covers an inner layer. In addition, the materials of the flexible substrate 110 and the inorganic barrier layer 114 are as described above and will not be described again.

As shown in FIGS. 6A and 6B, the organic dielectric layer 130 is disposed over the inorganic barrier layer 114 and includes an organic buffer layer 131 and an organic gate isolation layer 132. The organic gate isolation layer 132 is disposed on the organic buffer layer 131. The organic protective layer 160 is disposed on the organic gate isolation layer 132. Specifically, the fourth wire 141 is disposed between the organic buffer layer 131 and the organic gate isolation layer 132, and the fifth wire 142 is disposed over the organic gate isolation layer 132. In some embodiments, the fourth wire 141 is, for example, a data line, and the fifth wire 142 is, for example, a gate wire. In some embodiments, the fourth wire 141 and the fifth wire 142 include a metal material such as aluminum, copper, nickel, or silver. It is noted that the fourth wire 141 extends toward the display area 202 and is connected to the source/drain layer 150 in FIG. 4, such as the source region 152. The fifth wire 142 extends toward the display area 202 and is connected to the gate 194 in FIG. 4.

The first conductive via C1 is disposed in the organic buffer layer 131, and the two ends of the first conductive via C1 are in contact with the first wire 121 and the fourth wire 141 respectively, so that the first wire 121 is electrically connected with the fourth wire 141. Similarly, the second conductive via C2 is disposed in the organic buffer layer 131 and the organic gate isolation layer 132, and the two ends of the second conductive via C2 are in contact with the second wire 122 and the fifth wire 142 respectively, so that the second wire 122 is electrically connected to the fifth wire 142.

Figure 7A:
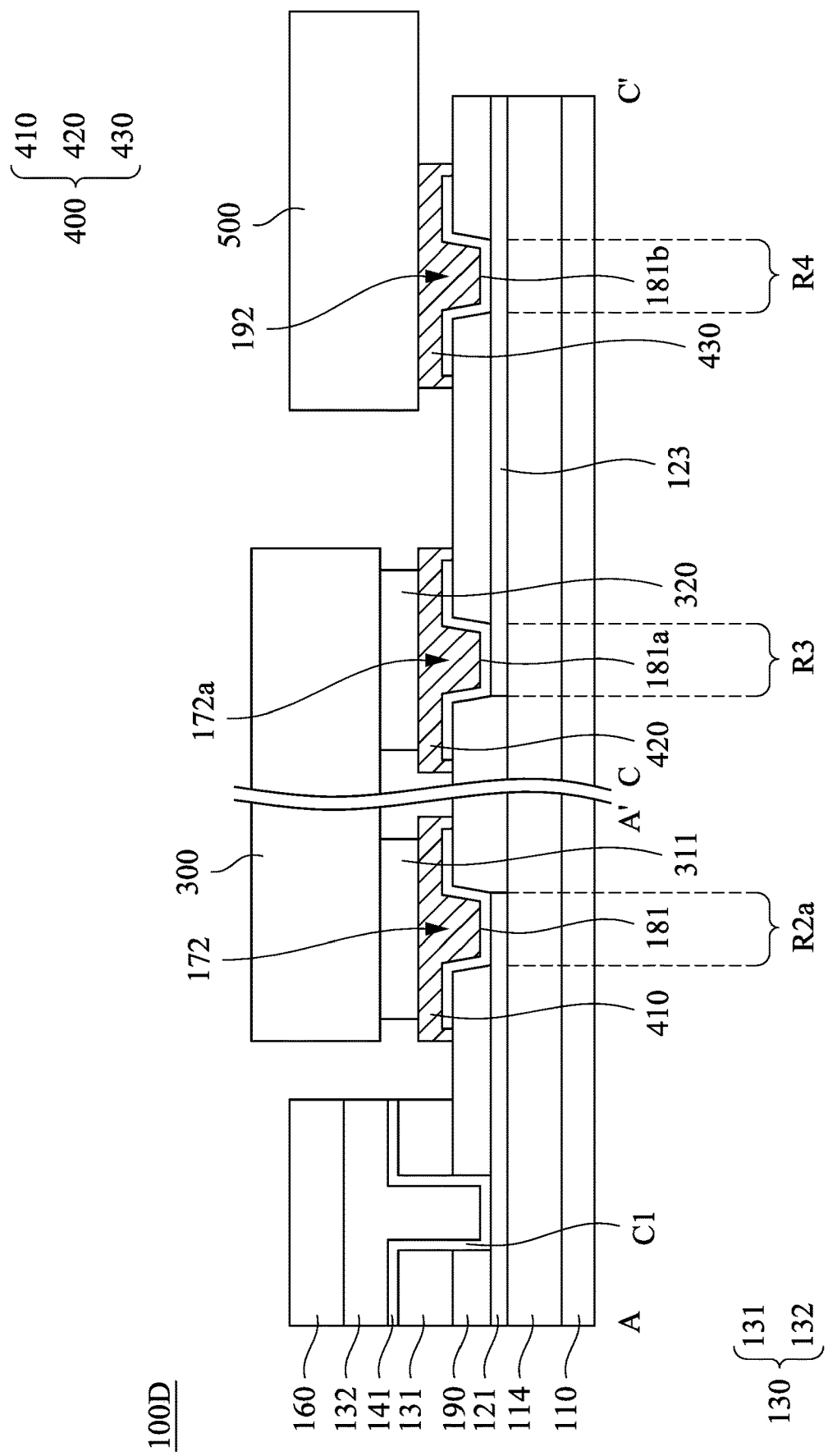
FIG. 7A is a schematic cross-sectional view of a circuit structure taken along cutting lines A-A' and C-C' according to an embodiment of the disclosure.
Figure 7B:
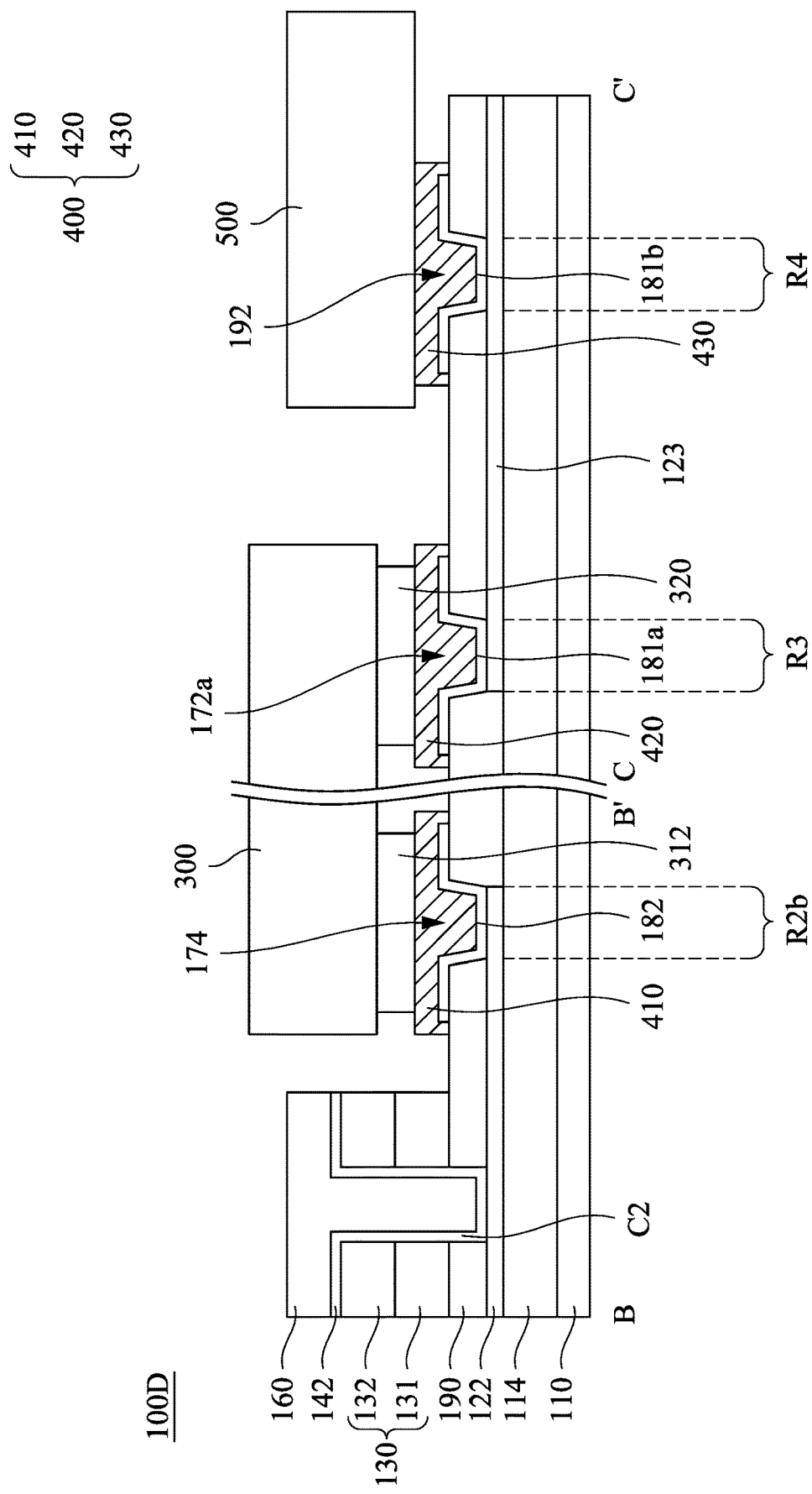
FIG. 7B is a schematic cross-sectional view of a circuit structure taken along cutting lines B-B' and C-C' according to an embodiment of the disclosure.

FIG. 7A illustrates a schematic cross-sectional view of a circuit structure 100D taken along a cutting line A-A' of FIG. 2 and a cutting line C-C' of FIG. 1, according to another embodiment of the disclosure. FIG. 7B illustrates a schematic cross-sectional view of a circuit structure 100D taken along a cutting line B-B' of FIG. 2 and a cutting line C-C' of FIG. 1. It is noted that, in FIGS. 7A and 7B, the same or like elements as those of FIGS. 6A and 6B are given the same reference numerals, and the related description is omitted. The circuit structure 100D in FIGS. 7A and 7B is similar to the circuit structure 100C in FIGS. 6A and 6B, and the difference is that the circuit structure 100D in FIGS. 7A and 7B further includes a protective layer 190. The protective layer 190 is disposed between the inorganic barrier layer 114 and the organic dielectric layer 130 and covers the first wire 121, the second wire 122, and the third wire 123.

The protective layer 190 has a first via hole 172 and a second via hole 174 in order to electrically connect the first metal bump 311 and the second metal bump 312 of the integrated circuit chip 300 with the first wire 121 and the second wire 122 embedded below the protective layer 190. The first via hole 172 exposes a first conductive connection region R2a of the first wire 121. The second via hole 174 exposes a second conductive connection region R2b of the second wire 122. Therefore, the first wire 121 can be electrically connected to the first metal bump 311 through the first conductive pad layer 181 and the anisotropic conductive adhesive layer 410 covering the first conductive pad layer 181. The second wire 122 is electrically connected to the second metal bump 312 through the second conductive pad layer 182 and the anisotropic conductive adhesive layer 410 covering the second conductive pad layer 182.

Specifically, the first conductive pad layer 181 covers a portion of the protective layer 190, a side wall of the first via hole 172, and the first conductive connection region R2a of the first wire 121. The anisotropic conductive adhesive layer 410 covers the first conductive pad layer 181 and fills the remaining portion of the first via hole 172. The second conductive pad layer 182 covers a portion of the protective layer 190, a side wall of the second via hole 174, and a second conductive connection region R2b of the second wire 122. The anisotropic conductive adhesive layer 410 covers the second conductive pad layer 182 and fills the remaining portion of the second via hole 174.

Similarly, the protective layer 190 has a third via hole 172a and a fourth via hole 192 in order to electrically connect the third metal bump 320 and the flexible circuit board 500 of the integrated circuit chip 300 with the third wire 123 embedded below the protective layer 190. The third via hole 172a exposes the third conductive connection region R3 of the third wire 123. The fourth via hole 192 exposes the fourth conductive connection region R4 of the third wire 123. Therefore, the third wire 123 can be electrically connected to the third metal bump 320 through the third conductive pad layer 181a and the anisotropic conductive adhesive layer 420 covering the third conductive pad layer 181a. In addition, the third wire 123 can be electrically connected to the flexible circuit board 500 through the fourth conductive pad layer 181b and the anisotropic conductive adhesive layer 430 covering the fourth conductive pad layer 181b.

Specifically, the third conductive pad layer 181a covers a portion of the protective layer 190, a side wall of the third via hole 172a, and a third conductive connection region R3 of the third wire 123. The anisotropic conductive adhesive layer 420 covers the third conductive pad layer 181a and fills the remaining portion of the third via hole 172a. The fourth conductive pad layer 181b covers a portion of the protective layer 190, a side wall of the fourth via hole 192, and a fourth conductive connection region R4 of the third wire 123. The anisotropic conductive adhesive layer 430 covers the fourth conductive pad layer 181b and fills the remaining portion of the fourth via hole 192.

Figure 8A:
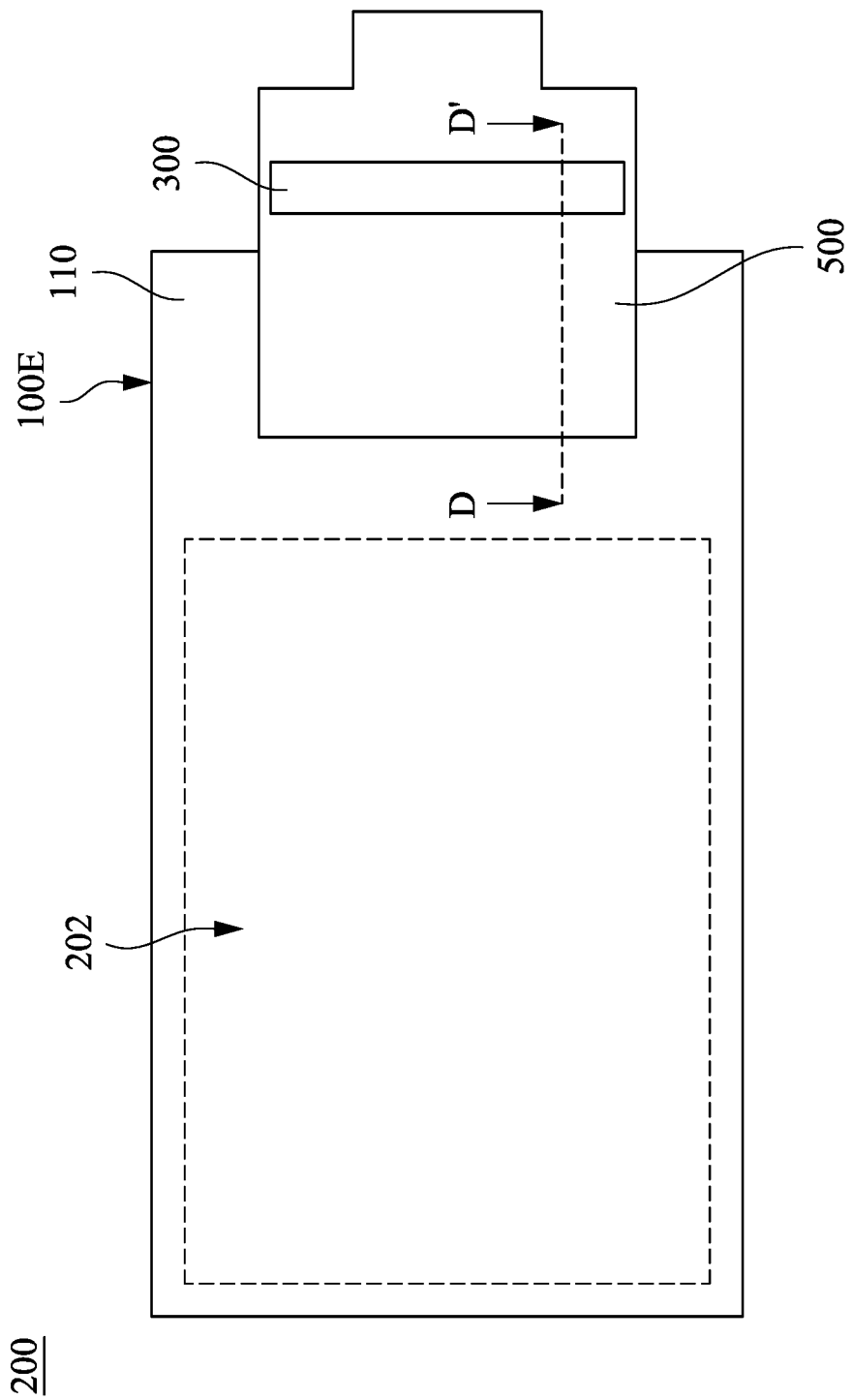
FIG. 8A is a schematic top view of a display device according to an embodiment of the disclosure.
Figure 8B:
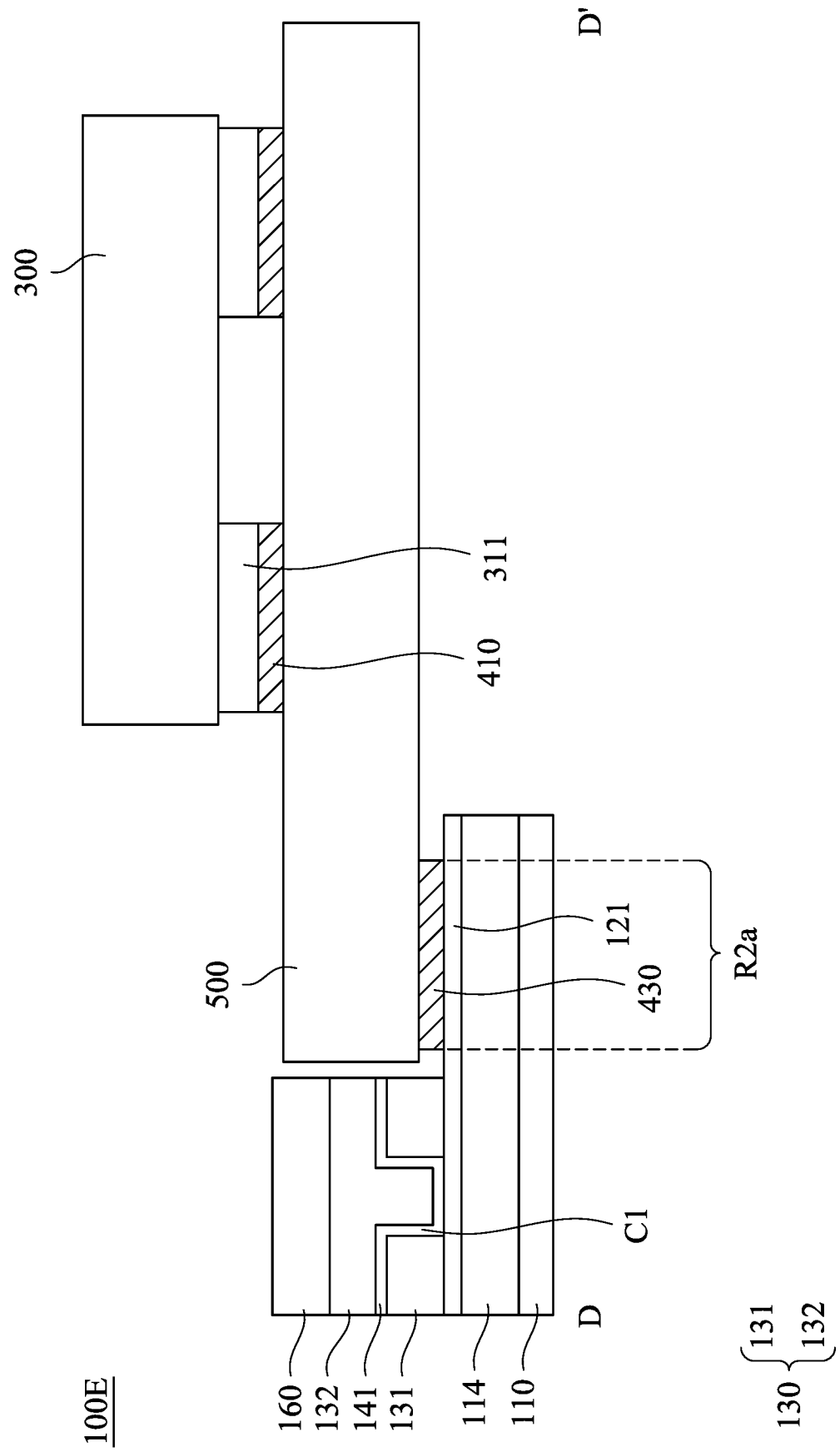
FIG. 8B is a schematic cross-sectional view of a circuit structure taken along a cutting line D-D' according to an embodiment of the disclosure.

The circuit structure of the disclosure is also applicable to a chip-on-film (COF) technology. Specifically, please refer to FIGS. 8A and 8B. FIG. 8A illustrates a schematic top view of a display device 200 according to another embodiment of the disclosure, and FIG. 8B is a schematic cross-sectional view of a circuit structure 100E taken along a cutting line D-D' of FIG. 8A. It is to be noted that, in FIG. 8B, the same or similar components as those of FIGS. 6A and 6B are given the same reference numerals, and the related description is omitted. The circuit structure 100E in FIGS. 8A and 8B is similar to the circuit structure 100C in FIGS. 6A and 6B. The difference is that the integrated circuit chip 300 of the circuit structure 100E in FIGS. 8A and 8B is disposed on the flexible circuit board 500, and the first wire 121 and the second wire (not shown) are directly electrically connected to the flexible circuit board 500. Specifically, the first wire 121 has a first conductive connection region R2a for being electrically connected to the flexible circuit board 500 through the anisotropic conductive adhesive layer 430. Similarly, the second wire (not shown) has a second conductive connection region (not shown) for being electrically connected to the flexible circuit board 500 through the anisotropic conductive adhesive layer 430. Accordingly, the first wire 121 and the second wire (not shown) can be electrically connected with the first metal bump 311 and the second metal bump of the integrated circuit chip 300 (not shown) through an internal line of the flexible circuit board 500.

Although the disclosure has been disclosed above in the embodiments, other embodiments are possible. Therefore, the spirit and scope of the claims are not limited to the descriptions contained in the embodiments herein.

It is apparent to those skilled in the art that various modifications and adaptations can be made without departing from the spirit and scope of the disclosure, and thus the claimed scope of the disclosure is defined by the appended claims.

What is claimed is:

1. A circuit structure, comprising:
   a flexible substrate;
   an inorganic barrier layer disposed over the flexible substrate;
   a first wire and a second wire disposed on the inorganic barrier layer and in contact with the inorganic barrier layer, wherein the first wire and the second wire are separated from each other;
   an organic dielectric layer disposed over the first wire and the second wire;
   a third wire disposed in the organic dielectric layer;
   a fourth wire disposed over the organic dielectric layer;
   a first conductive via disposed in the organic dielectric layer and in contact with the first wire and the third wire; and
   a second conductive via disposed in the organic dielectric layer and in contact with the second wire and the fourth wire,
   wherein the organic dielectric layer comprises an organic buffer layer and an organic gate isolation layer disposed on organic buffer layer, the third wire is disposed between the organic buffer layer and the organic gate isolation layer, and the fourth wire is disposed over the organic gate isolation layer.

2. The circuit structure of claim 1, further comprising:
   an integrated circuit chip electrically connected to the first wire and the second wire, wherein a horizontal distance between the first conductive via and an edge of the integrated circuit chip is 300 micrometers to 600 micrometers, and a horizontal distance between the second conductive via and an edge of the integrated circuit chip is 300 micrometers to 600 micrometers.

3. The circuit structure of claim 1, wherein the first wire and the second wire comprise molybdenum, molybdenum chromium alloy, aluminum, aluminum bismuth alloy, or titanium.

4. The circuit structure of claim 1, wherein the first wire is substantially parallel with the second wire.

5. The circuit structure of claim 2, wherein a distance between the first wire and the second wire ranges from 4 to 10 micrometers.

6. The circuit structure of claim 1, wherein the organic dielectric layer has a first via hole exposing an exposed portion of the first wire and a second via hole exposing an exposed portion of the second wire.

7. The circuit structure of claim 6, further comprising:
a first conductive pad layer covering a side wall of the first via hole and the exposed portion of the first wire; and
a second conductive pad layer covering a side wall of the second via hole and the exposed portion of the second wire.

8. The circuit structure of claim 7, wherein the third wire is in contact with the first conductive pad layer, and the fourth wire is in contact with the second conductive pad layer.

9. A circuit structure, comprising:
a flexible substrate;
an inorganic barrier layer disposed over the flexible substrate;
a first wire, a second wire and a third wire disposed on the inorganic barrier layer and in contact with the inorganic barrier layer, wherein the first wire, the second wire, and the third wire are separated from each other, the first wire has a first conductive connection region, the second wire has a second conductive connection region, and the third wire has a third conductive connection region and a fourth conductive connection region;
an organic dielectric layer disposed over the first wire and the second wire;
a fourth wire disposed in the organic dielectric layer;
a fifth wire disposed over the organic dielectric layer;
a first conductive via disposed in the organic dielectric layer and in contact with the first wire and the fourth wire; and
a second conductive via disposed in the organic dielectric layer and in contact with both the second wire and the fifth wire,
wherein the organic dielectric layer comprises an organic buffer layer and an organic gate isolation layer disposed on the organic buffer layer, the fourth wire is disposed between the organic buffer layer and the organic gate isolation layer, and the fifth wire is disposed over the organic gate isolation layer.

10. The circuit structure of claim 9, wherein the first wire, the second wire, and the third wire comprises titanium, nickel boride, or indium tin oxide.

11. The circuit structure of claim 9, wherein the first wire is substantially parallel with and the second wire.

12. The circuit structure of claim 11, wherein a distance between the first wire and the second wire ranges from 4 to 10 micrometers.

13. The circuit structure of claim 9, further comprising:
a protective layer disposed between the inorganic barrier layer and the organic dielectric layer and covering the first wire, the second wire, and the third wire, wherein the protective layer has a first via hole exposing the first conductive connection region of the first wire, a second via hole exposing the second conductive connection region of the second wire, a third via hole exposing the third conductive connection region of the third wire, and a fourth via hole exposing the fourth conductive connection region of the third wire.

14. The circuit structure of claim 13, further comprising:
a first conductive pad layer covering a side wall of the first via hole and the first conductive connection region of the first wire;
a second conductive pad layer covering a side wall of the second via hole and a second conductive connection region of the second wire;
a third conductive pad layer covering a side wall of the third via hole and a third conductive connection region of the third wire; and
a fourth conductive pad layer covering a side wall of the third via hole and a fourth conductive connection region of the third wire.

15. A circuit structure, comprising:
a flexible substrate;
an inorganic barrier layer disposed over the flexible substrate;
a first wire and a second wire disposed on the inorganic barrier layer and in contact with the inorganic barrier layer, wherein the first wire and the second wire are separated from each other;
an organic dielectric layer disposed over the first wire and the second wire;
a third wire disposed in the organic dielectric layer;
a fourth wire disposed over the organic dielectric layer;
a first conductive via disposed in the organic dielectric layer and in contact with the first wire and the third wire;
a second conductive via disposed in the organic dielectric layer and in contact with the second wire and the fourth wire; and
an integrated circuit chip electrically connected to the first wire and the second wire, wherein a horizontal distance between the first conductive via and an edge of the integrated circuit chip is 300 micrometers to 600 micrometers, and a horizontal distance between the second conductive via and an edge of the integrated circuit chip is 300 micrometers to 600 micrometers.

* * * * *